(12) United States Patent
Ainspan et al.

(10) Patent No.: US 8,912,854 B2
(45) Date of Patent: Dec. 16, 2014

(54) STRUCTURE FOR AN INDUCTOR-CAPACITOR VOLTAGE-CONTROLLED OSCILLATOR

(71) Applicant: International Business Machines Corporation, Armonk, NY (US)

(72) Inventors: Herschel A. Ainspan, New Hempstead, NY (US); Ram Kelkar, Burlington, VT (US); Anjali R. Malladi, Williston, VT (US); Ramana M. Malladi, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 13/734,364

(22) Filed: Jan. 4, 2013

(65) Prior Publication Data

US 2014/0191816 A1    Jul. 10, 2014

(51) Int. Cl.
*H03B 5/12*    (2006.01)
*H03C 3/22*    (2006.01)
(Continued)

(52) U.S. Cl.
CPC .............. *H03B 7/02* (2013.01); *G06F 17/5045* (2013.01); *H03B 7/06* (2013.01);
(Continued)

(58) Field of Classification Search
CPC .............. H03B 5/04; H03B 5/08; H03B 5/12; H03B 5/1206; H03B 5/1212; H03B 5/1228; H03B 5/1237; H03B 5/124; H03B 5/1243; H03B 5/1246; H03B 5/125; H03B 5/1253; H03B 5/1262; H03B 5/1265; H03B 2200/004; H03B 2200/005; H03B 2201/011; H03B 2200/0208; H03B 2202/042; H03L 1/00

USPC ....... 331/36 C, 117 FE, 117 R, 167, 185, 186
See application file for complete search history.

(56) References Cited

U.S. PATENT DOCUMENTS

| 5,175,512 | A | 12/1992 | Self |
| 5,440,277 | A | 8/1995 | Ewen et al. |

(Continued)

FOREIGN PATENT DOCUMENTS

| CN | 102201785 A | 9/2011 |
| JP | 2004120353 A | 4/2004 |

(Continued)

OTHER PUBLICATIONS

"Frequency Tuning Architecture for an OC192 Quadrature LC Voltage-Controlled Oscillator in 0.13um CMOS". IP.com IPCOM000022671D. IP.com Electronic Publication: Mar. 25, 2004. IP.com Prior Art Database at : http://www/ip.com/pubview/IPCOM000022671D.

(Continued)

*Primary Examiner* — Levi Gannon
(74) *Attorney, Agent, or Firm* — David M. Quinn

(57) ABSTRACT

Embodiments of the present invention provide a design structure and method for compensating for a change in frequency of oscillation (FOO) of an LC-tank VCO that includes a first node; second node; inductor; first capacitive network (FCN) that allows the design structure to obtain a target FOO; compensating capacitive (CCN) network that compensates for a change in the design structure's FOO; second capacitive network (SCN) that allows the design structure to obtain a desired FOO; a filter that supplies a voltage to the SCN and is coupled to the SCN; a transconductor that compensates for a change in the design structure's FOO; and a sub-circuit coupled to the SCN that generates and supplies voltage to the CCN sufficient to allow the CCN to compensate for a reduction in the design structure's FOO. The first and second nodes are coupled to the inductor, FCN, CCN, SCN, and sub-circuit.

21 Claims, 3 Drawing Sheets

(51) Int. Cl.
*H03B 7/02* (2006.01)
*G06F 17/50* (2006.01)
*H03B 7/06* (2006.01)
*H03B 5/04* (2006.01)

(52) U.S. Cl.
CPC ............ *H03B 5/04* (2013.01); *H03B 5/1212* (2013.01); *H03B 5/1253* (2013.01); *H03B 5/1243* (2013.01); *H03B 5/1265* (2013.01); *H03B 5/1228* (2013.01); *H03B 2200/005* (2013.01); *H03B 2202/042* (2013.01); *H03B 2200/004* (2013.01); *H03B 2201/0208* (2013.01)
USPC ............... 331/117 FE; 331/36 C; 331/177 V; 331/185

(56) References Cited

U.S. PATENT DOCUMENTS

| | | | |
|---|---|---|---|
| 5,442,325 A | 8/1995 | Bosshart | |
| 5,673,008 A | 9/1997 | Sumita | |
| 5,714,914 A * | 2/1998 | Zhou | 331/117 R |
| 5,847,616 A | 12/1998 | Ng et al. | |
| 6,043,720 A | 3/2000 | Van Veenendaal et al. | |
| 6,417,727 B1 | 7/2002 | Davis | |
| 6,690,243 B1 | 2/2004 | Henrion | |
| 6,724,273 B1 * | 4/2004 | Jones | 331/177 V |
| 6,853,262 B2 * | 2/2005 | Feilkas et al. | 331/117 R |
| 7,075,379 B2 * | 7/2006 | Rana et al. | 331/117 FE |
| 7,099,643 B2 | 8/2006 | Lin | |
| 7,116,183 B2 * | 10/2006 | Wu | 331/176 |
| 7,154,349 B2 * | 12/2006 | Cabanillas | 331/117 R |
| 7,276,979 B2 * | 10/2007 | Ishida et al. | 331/17 |
| 7,321,271 B2 * | 1/2008 | Takinami et al. | 331/117 R |
| 7,365,610 B2 * | 4/2008 | Zhang | 331/36 C |
| 7,474,166 B2 * | 1/2009 | Tanaka | 331/177 V |
| 7,586,380 B1 | 9/2009 | Natarajan et al. | |
| 7,586,381 B2 * | 9/2009 | Rohde et al. | 331/96 |
| 7,663,447 B2 | 2/2010 | Matsuzaki | |
| 7,907,003 B2 | 3/2011 | Pulijala et al. | |
| 8,013,682 B2 * | 9/2011 | Hu et al. | 331/16 |
| 2005/0017813 A1 | 1/2005 | Rana et al. | |
| 2007/0085620 A1 * | 4/2007 | Ohkubo et al. | 331/177 V |
| 2008/0150644 A1 | 6/2008 | Hosoya et al. | |
| 2010/0102859 A1 | 4/2010 | Fattaruso | |

FOREIGN PATENT DOCUMENTS

| | | |
|---|---|---|
| JP | 201110343 A | 1/2011 |
| WO | 2004008639 A3 | 1/2004 |

OTHER PUBLICATIONS

Li, S. et al. "A High-Speed Wide-Range Low-Distortion Constant gm Cell Design for GHz Applications". pp. 4823-4826. Copyright 2005 IEEE.

Tanzi, N. "Fully Integrated, Low-Noise, Differential Voltage Controlled Oscillator not Requiring a Tail Current Source or Cross Coupled Transistors". IP.comIPCOM000183321D. IP.com Electronic Publication: May 18, 2009. Copyright 2009 Motorola, Inc. IP.com Prior Art Database at: http://www.ip.com/pubview/IPCOM000183321D.

* cited by examiner

STRUCTURE FOR AN INDUCTOR-CAPACITOR VOLTAGE-CONTROLLED OSCILLATOR

FIELD OF THE INVENTION

The present invention relates generally to the field of design structures, and specifically to a design structure for an inductor-capacitor voltage-controlled oscillator.

BACKGROUND OF THE INVENTION

Inductor-capacitor voltage-controlled oscillators (LC tank VCOs) generate signals at a particular frequency, or are able to pick out a signal at a particular frequency from a more complex signal. LC tank VCOs are employed in a broad range of integrated circuit applications including frequency tuning, voltage/current magnification, RF amplifiers, and Foster-Seeley discriminators. An LC tank VCO includes an inductor-capacitor tuned circuit (LC tank) which oscillates at a particular frequency (frequency of oscillation) determined by the characteristics of both the inductor and the capacitor. The LC tank generally includes two groups of capacitive elements (a bank of digitally selectable elements and a continuous frequency control element) so that, in operation, the approximate target frequency can be selected by the bank while the continuous frequency control element allows the LC tank to settle on a particular frequency.

However, the LC tank is not self-sustaining and loses energy over time, which results in the frequency of oscillation gradually decreasing in amplitude. To combat the loss in energy and the concomitant frequency of oscillation decrease, an LC tank VCO employs an amplifier, for example, a transconductor, which generates negative resistance and provides an amount of energy to the LC tank equal to that which is lost by the LC tank to maintain LC tank oscillation.

SUMMARY

Embodiments of the present invention provide a design structure and method for compensating for a change in frequency of oscillation of an inductor-capacitor voltage-controlled oscillator that includes a first node, a second node, an inductor coupled to the first node and the second node. The design structure also includes a first capacitive network coupled to the first node and second node, wherein the first capacitive network is designed to allow the design structure to obtain an approximate target frequency of oscillation; a second capacitive network coupled to the first node and the second node, wherein the second capacitive network allows the design structure to obtain a desired frequency of oscillation; and a filter coupled to the second capacitive network, wherein the filter supplies a voltage to the second capacitive network.

Further, the design structure also includes; a transconductor coupled to the first node and the second node, wherein the transconductor is designed to compensate for a change in the frequency of oscillation in the design structure; and a sub-circuit coupled to the compensating capacitive network, wherein the voltage sensing circuit generates and supplies voltage to the compensating capacitive network sufficient to allow the compensating capacitive network to compensate for the reduction in frequency of oscillation of the design structure.

In certain embodiments, the first capacitive network includes a first capacitive branch; the first capacitive branch includes a varactor, transistor, field-effect transistor, capacitor, or a capacitive element; the first capacitive network is controlled by an input data bit, wherein a value of the input data bit determines a capacitance generated by the first capacitive network; the second capacitive network includes a second capacitive branch; the second capacitive branch includes a varactor, transistor, field-effect transistor, capacitor, or a capacitive element; and the compensating capacitive network includes a third capacitive branch. In other embodiment, the third capacitive branch includes a source, drain and body shorted FET; the third capacitive branch includes a varactor, transistor, field-effect transistor, capacitor, or any capacitive element; and the transconductor includes a pair of cross-coupled field-effect transistors.

In yet still other embodiments, the sub-circuit comprises: a first resistor coupled to a supply voltage; a second resistor coupled to the first resistor via a first node; a first field-effect transistor gate-coupled to the first node via a second node, wherein the first field-effect transistor is source-coupled to the supply voltage, and wherein the first field-effect transistor is drain-coupled to a third resistor via a third node; a second field-effect transistor gate-coupled to the third node via a fourth node, wherein the first field-effect transistor is source-coupled to the supply voltage, and wherein the second field-effect transistor is drain-coupled to a fourth resistor via a fifth node; a third field-effect transistor gate-coupled to the fifth node via a sixth node, wherein the third field-effect transistor is source-coupled to the supply voltage, and wherein the third field-effect transistor is drain-coupled to a fifth resistor via a seventh node; wherein the second resistor, third resistor, fourth resistor, and fifth resistor are ground coupled; and wherein the sub-circuit is coupled to the compensating capacitive network via an eighth node.

DETAILED DESCRIPTION

The present invention discloses a method and design for compensating for supply voltage dependence in an inductor-capacitor voltage-controlled oscillator (LC tank VCO). Typically, the frequency of oscillation of an LC tank VCO is sensitive to the supply voltage ($V_{ra}$), wherein frequency of oscillation suffers from an unintended change relative to its nominal frequency of oscillation (frequency drift). This frequency drift can result in a reduction in the frequency of oscillation range (tuning range) over which the LC tank VCO can be adjusted/operated in consideration of particular system requirements.

Figure 1:
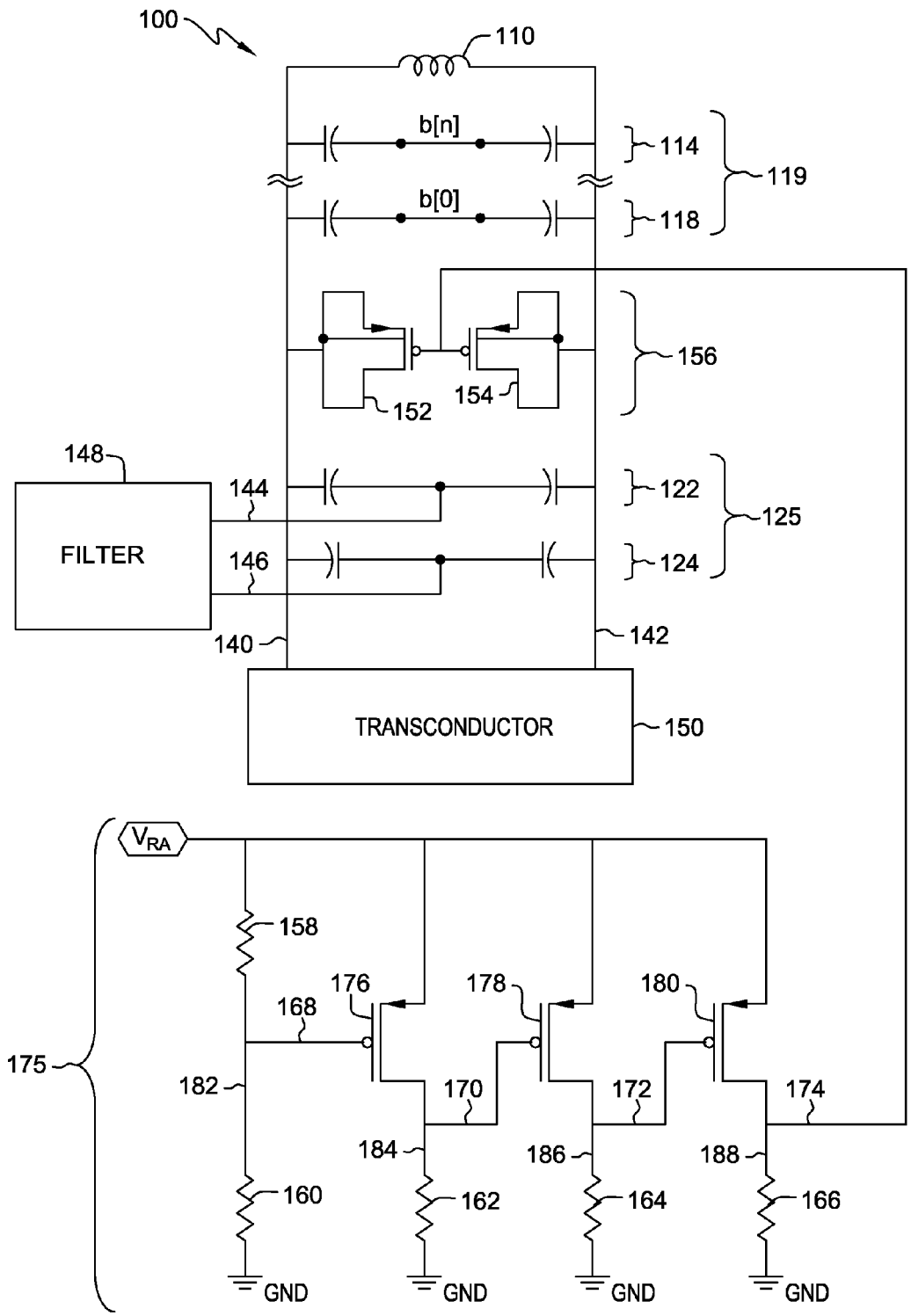
FIG. 1 depicts a LC tank VCO, in accordance with an embodiment of the present invention.

FIG. 1 depicts a LC tank VCO, in accordance with an embodiment of the invention. Circuit configuration 100 includes nodes 140 and 142, inductor 110, first capacitive network 119, second capacitive network 125, filter 148, transconductor 150, compensating capacitive network 156, and sub-circuit 175. Nodes 140 and 142 are coupled to inductor 110, first capacitive network 119, second capacitive network 125, filter 148, transconductor 150, and compensating capacitive network 156.

First capacitive network 119 is a digitally selectable varactor network that allows circuit 100 to obtain an approximate target frequency of oscillation. First capacitive network includes capacitive branches 114 and 118. Although not shown, first capacitive network 119 may include less or additional capacitive branches than depicted. Capacitive branches 114 and 118 may each include two varactors and each capacitive branch is coupled to nodes 140 and 142. In an embodiment, capacitive branch 114 and/or capacitive branch 118 may include, for example, a varactor, transistor, field-effect transistor, capacitor, or a capacitive element.

Capacitive branches 114 and 118 are controlled by tune bits b[0] and b[n] respectively, which influence the capacitance of capacitive branches 114 and 118 by supplying a center voltage. For example, when a tune bit value is zero, the associated capacitive branch is active; however, when that value is one, the associated capacitive branch is not active.

Second capacitive network 125 can be a continuous frequency control capacitive network that allows circuit 100 to be tuned to a desired frequency of oscillation. Second capacitive network 125 can include capacitive branches 122 and 124. Further, capacitive branches 122 and 124 may each include two varactors coupled in series. Further still, capacitive branches 122 and 124 may include, for example, a varactor, capacitor, transistor, field-effect transistors, or a capacitive element, capable of generating a desired capacitance to allow circuit 100 to generate a desired frequency of oscillation. Further still, capacitive branches 122 and 124 may each be coupled to nodes 140 and node 142. Second capacitive network 125 may receive a continuous voltage supplied by filter 148 via nodes 144 and 146, which are coupled to a common junction of capacitive branches 122 and 124, respectively.

As discussed above, although a LC tank VCO, for example, circuit 100, may generate a desired frequency of oscillation, unless driven by an additional force supplied by, for example, transconductor 150, the generated frequency of oscillation will eventually decrease to zero. Transconductor 150 is a transconductor, for example, a $g_m$ cell, which can maintain a frequency of oscillation generated by circuit 100 by supplying negative transductance ($-g_m$) to circuit 100 to compensate for a change in frequency of oscillation of circuit 100. In an embodiment, transconductor 150 can be a $g_m$ cell that includes at least two cross coupled FETs. In certain embodiments, transconductor 150 may include at least one of the following characteristics: high bandwidth, low noise, low power consumption, high output impedance, low distortion, or good common mode rejections. In general, transconductor 150 may be any transconductor capable of supplying negative $g_m$ to circuit 100 sufficient to compensate for a change in frequency of oscillation of circuit 100.

As discussed above, the frequency of oscillation of an LC tank VCO, for example, circuit 100, is sensitive to supply voltage, $V_{ra}$, whereby an increase in $V_{ra}$ results in a change in the tuning range (frequency of oscillation) of circuit 100. Change in frequency of oscillation can be viewed in terms of capacitance utilizing formula [1].

$$f=1/[2\pi\sqrt{(LC)}] \quad [1]$$

wherein f is the frequency of oscillation, L is inductance and C is capacitance. The difference in capacitance due to a change in $V_{ra}$ is the voltage dependence determination, $V_{DD}$. Once $V_{DD}$ is determined, a compensating capacitor branch, for example, compensating capacitor branch 156, can be designed whose voltage-dependence is opposite to that of the LC tank VCO ($-V_{DD}$).

Compensating capacitive network 156 is a capacitive network designed to compensate for a change in frequency of oscillation of circuit 100 that can result from a change in $V_{ra}$. Compensating capacitive network 156 include FETs 152 and 154, which may be gate-coupled to each other and are both source-drain-body shorted. In an embodiment, FET 152 and/or FET 154 can be a varactor. Although compensating capacitive network 156 is depicted as including a FET, compensating capacitive network 156 can include, for example, a varactor, transistor, capacitor, or any type of capacitive element. In general, compensating capacitive network 156 may be any capacitive network capable of compensating for a change in frequency of oscillating caused by a change in $V_{ra}$ in a circuit, for example, circuit 100.

Compensating capacitive network 156 may be designed to compensate for $V_{DD}$. For example, knowing the change in frequency due to a change of $V_{DD}$, equation [1], can be used to calculate an equivalent change in capacitance (C). For example if this change in equivalent capacitance is 10 fF due to an increase in $V_{DD}$, then compensating capacitive network 156 may be designed to provide a capacitance which decreases by 10 fF in the same voltage ($V_{DD}$) range thereby cancelling effective capacitance variation. The capacitance generated by compensating capacitive network 156 can be powered by sub-circuit 175, which may be designed to provide a desired voltage polarity and magnitude to compensating capacitive network 156 to achieve a desired capacitance, for example, −10 fF.

Sub-circuit 175 can be coupled to a common junction of FETs 152 and 154. Sub-circuit 175 may generate and apply a desired voltage to compensating capacitive network 156 via node 174. Sub-circuit 175 can include resistor 158 coupled to $V_{RA}$. Resistor 158 can be coupled to resistor 160 via node 182. FET 176 may be gate-coupled to node 182, via node 168, source coupled to $V_{ra}$, and drain-coupled to resistor 162 via node 184. FET 178 may be gate-coupled to node 184 via node 170, source coupled to $V_{R4}$, and drain coupled to resistor 164 via node 158. FET 180 may be gate-coupled to node 186 via node 172, source coupled to $V_{R4}$, and drain coupled to resistor 166, via node 186. Sub-circuit 175 is coupled to compensating capacitive network 156 via node 174. Resistors 160, 162, 164, and 166 may be grounded.

Although not shown, sub-circuit 175 may include additional or less components than those depicted. Further, sub-circuit 175 may include any type of resistor and/or any type of FET. Further still, sub-circuit 175 may include any number of electrical components necessary to generate and supply a desired voltage to compensating capacitive network 156.

Figure 2:
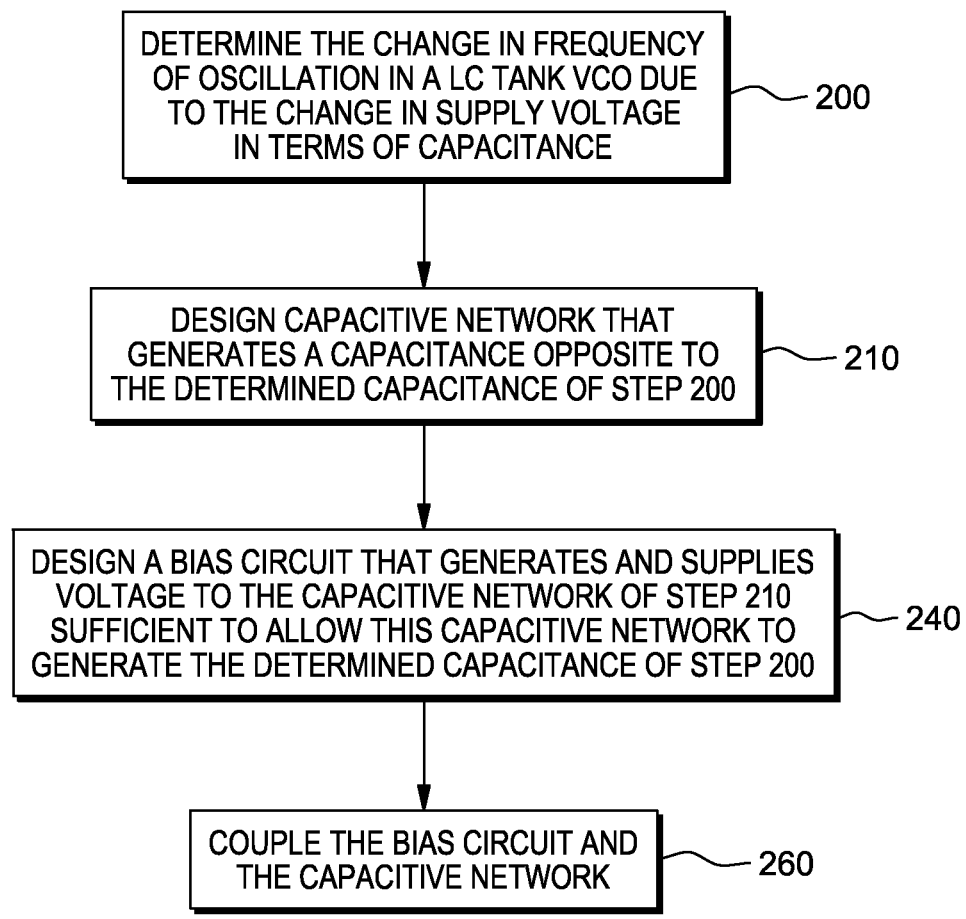
FIG. 2 is a flowchart illustrating the steps to design the circuit of FIG. 1, in accordance with an embodiment of the present invention.

FIG. 2 is a flowchart illustrating the steps to design the circuit of FIG. 1, in accordance with an embodiment of the present invention. Determine a change in capacitance experienced by a LC tank VCO resulting from a change in frequency of oscillation due to a change in $V_{ra}$ in the LC tank VCO (step 200). Design a compensating capacitive network that generates a capacitance opposite to the determined change in capacitance (step 210). Design a bias circuit that generates and supplies voltage to the compensating capacitive network sufficient to allow the capacitive network to generate the desired capacitance of step 210 (step 240). Couple the bias circuit to the compensating capacitive network and couple the compensating capacitive network to the LC tank VCO (step 260).

Figure 3:
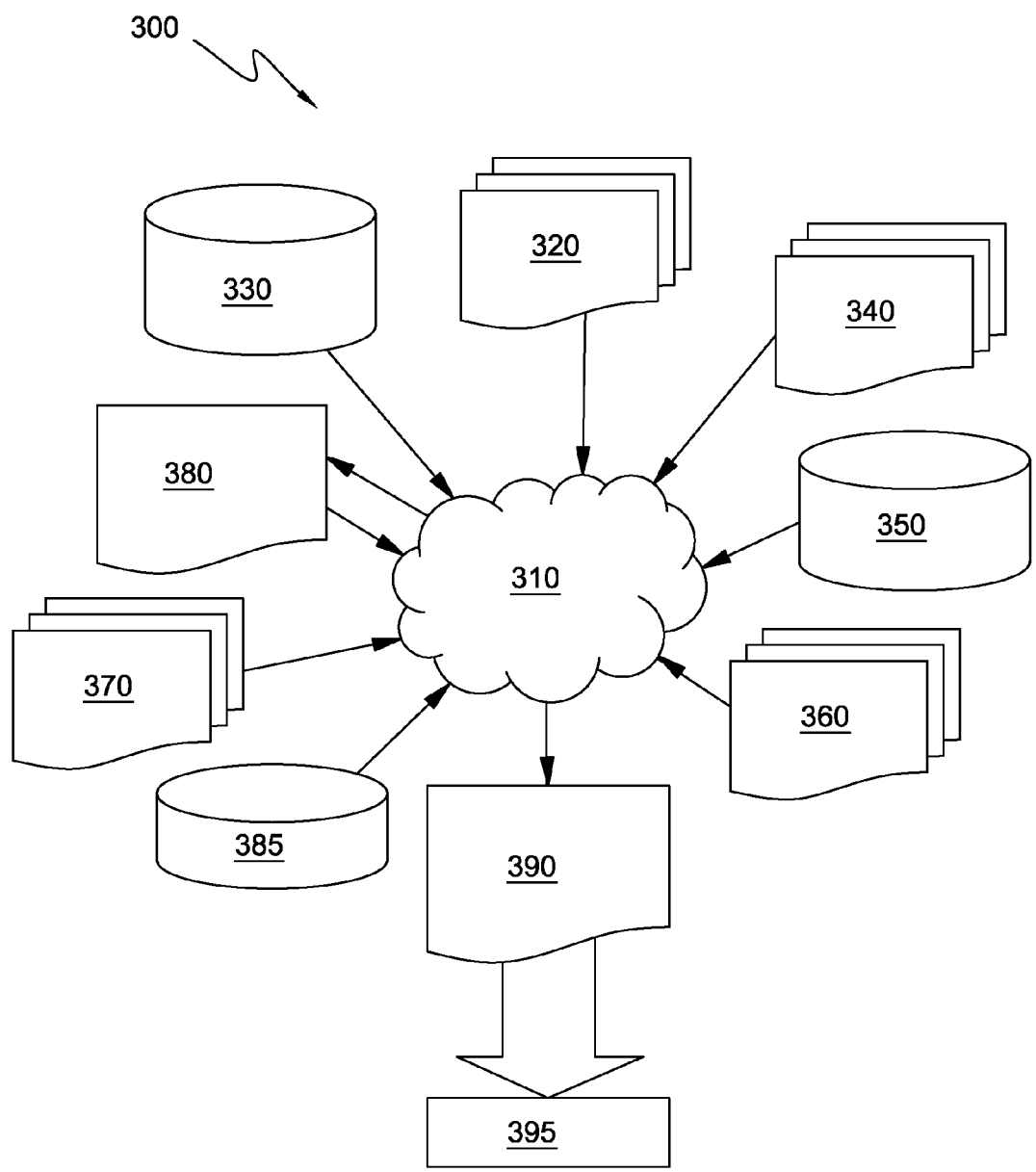
FIG. 3 is a flow diagram of a design process used in semiconductor design, manufacture, and/or test.

FIG. 3 depicts a block diagram of an exemplary design flow 300 used for example, in semiconductor IC logic design, simulation, test, layout, and manufacture. Design flow 300 includes processes, machines and/or mechanisms for processing design structures or devices to generate logically or otherwise functionally equivalent representations of the design structures and/or devices described above and shown in FIG. 1. The design structures processed and/or generated by design flow 300 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). Design flow 300 may vary depending on the type of representation being designed. For example, a design flow 300 for building an application specific IC (ASIC) may differ from a design flow 300 for designing a standard component or from a design flow 300 for instantiating the design into a programmable array, for example a programmable gate array (PGA) or a field programmable gate array (FPGA) offered by Altera® Incorporated or Xilinx® Incorporated.

FIG. 3 illustrates multiple such design structures including an input design structure 320 that is preferably processed by a design process 310. Design structure 320 may be a logical simulation design structure generated and processed by design process 310 to produce a logically equivalent functional representation of a hardware device. Design structure 320 may also or alternatively comprise data and/or program instructions that when processed by design process 310, generate a functional representation of the physical structure of a hardware device. Whether representing functional and/or structural design features, design structure 320 may be generated using electronic computer-aided design (ECAD) such as implemented by a core developer/designer. When encoded on a machine-readable data transmission, gate array, or storage medium, design structure 320 may be accessed and processed by one or more hardware and/or software modules within design process 310 to simulate or otherwise functionally represent an electronic component, circuit, electronic or logic module, apparatus, device, or system such as those shown in FIG. 1. As such, design structure 320 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 310 preferably employs and incorporates hardware and/or software modules for synthesizing, translating, or otherwise processing a design/simulation functional equivalent of the components, circuits, devices, or logic structures shown in FIG. 1 to generate a Netlist 380 which may contain design structures such as design structure 320. Netlist 380 may comprise, for example, compiled or otherwise processed data structures representing a list of wires, discrete components, logic gates, control circuits, I/O devices, models, etc. that describes the connections to other elements and circuits in an integrated circuit design. Netlist 380 may be synthesized using an iterative process in which netlist 380 is resynthesized one or more times depending on design specifications and parameters for the device. As with other design structure types described herein, netlist 380 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 310 may include hardware and software modules for processing a variety of input data structure types including Netlist 380. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 385, which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310 without deviating from the scope and spirit of the invention. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320, together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 320, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 390 may comprise a compiled, executable HDL simulation model that functionally simulates the devices shown in FIG. 1.

Design structure 390 may also employ a data format used for the exchange of layout data of integrated circuits and/or symbolic data format (e.g. information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 390 may then proceed to a stage 395 where, for example, design structure 390 proceeds to tape-out, is released to manufacturing, is released to a mask house, is sent to another design house, is sent back to the customer, etc.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed is:

1. A circuit, comprising:
   a first node;
   a second node;
   an inductor coupled to the first node and the second node;
   a first capacitive network coupled to the first node and second node, wherein the first capacitive network is designed to allow the circuit to obtain an approximate target frequency of oscillation;
   a compensating capacitive network coupled to the first node and the second node, wherein the compensating capacitive network is designed to compensate for a change in frequency of oscillation of the circuit caused by a supply voltage dependence of the circuit;
   a second capacitive network coupled to the first node and the second node, wherein the second capacitive network allows the circuit to obtain a desired frequency of oscillation;
   a filter coupled to the second capacitive network, wherein the filter supplies a voltage to the second capacitive network;
   a transconductor coupled to the first node and the second node, wherein the transconductor is designed to compensate for a change in the frequency of oscillation in the circuit; and
   a sub-circuit coupled to the compensating capacitive network, wherein the sub-circuit generates and supplies voltage to the compensating capacitive network sufficient to allow the compensating capacitive network to compensate for a reduction in frequency of oscillation of the circuit, and wherein the sub-circuit includes at least one field-effect transistor gate-coupled to a node via another node, wherein the sub-circuit comprises:
   a first resistor coupled to a supply voltage;
   a second resistor coupled to the first resistor via a first node;
   a first field-effect transistor gate-coupled to the first node via a second node, wherein the first field-effect transistor is source-coupled to the supply voltage, and wherein the first field-effect transistor is drain-coupled to a third resistor via a third node;
   a second field-effect transistor gate-coupled to the third node via a fourth node, wherein the first field-effect transistor is source-coupled to the supply voltage, and wherein the second field-effect transistor is drain-coupled to a fourth resistor via a fifth node;
   a third field-effect transistor gate-coupled to the fifth node via a sixth node, wherein the third field-effect transistor is source-coupled to the supply voltage, and wherein the third field-effect transistor is drain-coupled to a fifth resistor via a seventh node;
   wherein the second resistor, third resistor, fourth resistor, and fifth resistor are ground coupled; and
   wherein the sub-circuit to the compensating capacitive network via an eighth node.

2. The circuit of claim 1, wherein the first capacitive network includes a first capacitive branch.

3. The circuit of claim 2, wherein the first capacitive branch includes a varactor, transistor, field-effect transistor, capacitor, or a capacitive element.

4. The circuit of claim 1, wherein the first capacitive network is controlled by an input data bit, wherein a value of the input data bit determines a capacitance generated by the first capacitive network.

5. The circuit of claim 1, wherein the second capacitive network includes a second capacitive branch.

6. The circuit of claim 5, wherein the second capacitive branch includes a varactor, transistor, field-effect transistor, capacitor, or a capacitive element.

7. The circuit of claim 1, wherein the compensating capacitive network includes a third capacitive branch.

8. The circuit of claim 7, wherein the third capacitive branch includes a source, drain and body shorted FET.

9. The circuit of claim 7, wherein the third capacitive branch includes a varactor, transistor, field-effect transistor, capacitor, or any capacitive element.

10. The circuit of claim 1, wherein the transconductor includes a pair of cross-coupled field-effect transistors.

11. A design process comprising:
    translating a hardware description language (HDL) design structure encoded on a tangible machine-readable data storage medium to a second design structure, said HDL design structure comprising elements that when processed in a computer-aided design system generates a machine-executable representation of an inductor-capacitor voltage-controlled oscillator, wherein said HDL design structure comprises:
    a first node;
    a second node;
    an inductor coupled to the first node and the second node;
    a first capacitive network coupled to the first node and second node, wherein the first capacitive network is designed to allow the design structure to obtain an approximate target frequency of oscillation;
    a compensating capacitive network coupled to the first node and the second node, wherein the compensating capacitive network is designed to compensate for a change in frequency of oscillation of the design structure caused by a supply voltage dependence of the design structure;
    a second capacitive network coupled to the first node and the second node, wherein the second capacitive network allows the design structure to obtain a desired frequency of oscillation;
    a filter coupled to the second capacitive network, wherein the filter supplies a voltage to the second capacitive network;
    a transconductor coupled to the first node and the second node, wherein the transconductor is designed to compensate for a change in the frequency of oscillation in the design structure; and
    a sub-circuit coupled to the compensating capacitive network, wherein the sub-circuit generates and supplies voltage to the compensating capacitive network sufficient to allow the compensating capacitive network to compensate for a reduction in frequency of oscillation of the design structure, wherein the sub-circuit comprises:
a first resistor coupled to a supply voltage;
a second resistor coupled to the first resistor via a first node;
a first field-effect transistor gate-coupled to the first node via a second node, wherein the first field-effect transistor is source-coupled to the supply voltage, and wherein the first field-effect transistor is drain-coupled to a third resistor via a third node;
a second field-effect transistor gate-coupled to the third node via a fourth node, wherein the first field-effect transistor is source-coupled to the supply voltage, and wherein the second field-effect transistor is drain-coupled to a fourth resistor via a fifth node;
a third field-effect transistor gate-coupled to the fifth node via a sixth node, wherein the third field-effect transistor is source-coupled to the supply voltage, and wherein the third field-effect transistor is drain-coupled to a fifth resistor via a seventh node;
wherein the second resistor, third resistor, fourth resistor, and fifth resistor are ground coupled; and
wherein the sub-circuit is coupled to the compensating capacitive network via an eighth node.

12. The design process of claim 11, wherein the first capacitive network includes a first capacitive branch.

13. The design process of claim 12, wherein the first capacitive branch includes a varactor, transistor, field-effect transistor, capacitor, or a capacitive element.

14. The design process of claim 11, wherein the first capacitive network is controlled by an input data bit, wherein a value of the input data bit determines a capacitance generated by the first capacitive network.

15. The design process of claim 11, wherein the second capacitive network includes a second capacitive branch.

16. The design process of claim 15, wherein the second capacitive branch includes a varactor, transistor, field-effect transistor, capacitor, or a capacitive element.

17. The design process of claim 11, wherein the compensating capacitive network includes a third capacitive branch.

18. The design process of claim 17, wherein the third capacitive branch includes a source, drain and body shorted FET.

19. The design structure of claim 17, wherein the third capacitive branch includes a varactor, transistor, field-effect transistor, capacitor, or any capacitive element.

20. The design process of claim 11, wherein the transconductor includes a pair of cross-coupled field-effect transistors.

21. A circuit, comprising:
a first node;
a second node;
an inductor coupled to the first node and the second node;
a first capacitive network coupled to the first node and second node, wherein the first capacitive network is designed to allow the circuit to obtain an approximate target frequency of oscillation, wherein the first capacitive network includes a first capacitive branch, wherein the first capacitive branch includes a varactor, transistor, field-effect transistor, capacitor, or a capacitive element, and wherein the first capacitive network is controlled by an input data bit, and wherein a value of the input data bit determines a capacitance generated by the first capacitive network;
a compensating capacitive network coupled to the first node and the second node, wherein the compensating capacitive network is designed to compensate for a change in frequency of oscillation of the circuit caused by a supply voltage dependence of the circuit, wherein the compensating capacitive network includes a third capacitive branch, wherein the third capacitive branch includes a source, drain and body shorted FET;
a second capacitive network coupled to the first node and the second node, wherein the second capacitive network allows the design structure to obtain a desired frequency of oscillation, wherein the second capacitive network includes a second capacitive branch, wherein the capacitive branch includes a varactor, transistor, field-effect transistor, capacitor, or a capacitive element;
a filter coupled to the second capacitive network, wherein the filter supplies a continuous voltage to the second capacitive network;
a transconductor coupled to the first node and the second node, wherein the transconductor is designed to compensate for a change in the frequency of oscillation in the design structure, and wherein the transconductor includes a pair of cross-coupled field-effect transistors; and
a sub-circuit coupled to the compensating capacitive network, wherein the sub-circuit generates and supplies voltage to the compensating capacitive network sufficient to allow the compensating capacitive network to compensate for a reduction in frequency of oscillation of the circuit, and wherein the sub-circuit comprises:
a first resistor coupled to a supply voltage;
a second resistor coupled to the first resistor via a first node;
a first field-effect transistor gate-coupled to the first node via a second node, wherein the first field-effect transistor is source-coupled to the supply voltage, and wherein the first field-effect transistor is drain-coupled to a third resistor via a third node;
a second field-effect transistor gate-coupled to the third node via a fourth node, wherein the first field-effect transistor is source-coupled to the supply voltage, and wherein the second field-effect transistor is drain-coupled to a fourth resistor via a fifth node;
a third field-effect transistor gate-coupled to the fifth node via a sixth node, wherein the third field-effect transistor is source-coupled to the supply voltage, and wherein the third field-effect transistor is drain-coupled to a fifth resistor via a seventh node;
wherein the second resistor, third resistor, fourth resistor, and fifth resistor are ground coupled; and
wherein the sub-circuit is coupled to the compensating capacitive network via an eighth node.

* * * * *